(12) United States Patent
Kulick et al.

(10) Patent No.: US 9,844,139 B2
(45) Date of Patent: Dec. 12, 2017

(54) METHOD OF INTERCONNECTING MICROCHIPS

(71) Applicant: Indiana Integrated Circuits, LLC, South Bend, IN (US)

(72) Inventors: Jason M. Kulick, South Bend, IN (US); Tian Lu, Osceola, IN (US)

(73) Assignee: Indiana Integrated Circuits, LLC, South Bend, IN (US)

( * ) Notice: Subject to any disclaimer, the term of this patent is extended or adjusted under 35 U.S.C. 154(b) by 499 days.

(21) Appl. No.: 14/211,127

(22) Filed: Mar. 14, 2014

(65) Prior Publication Data
US 2014/0268592 A1    Sep. 18, 2014

Related U.S. Application Data

(60) Provisional application No. 61/802,504, filed on Mar. 16, 2013.

(51) Int. Cl.
*H05K 3/34* (2006.01)
*H05K 1/18* (2006.01)

(52) U.S. Cl.
CPC .............. *H05K 1/18* (2013.01); *H05K 1/181* (2013.01); *H05K 3/34* (2013.01); *H05K 2201/1053* (2013.01); *Y02P 70/611* (2015.11); *Y10T 29/49128* (2015.01)

(58) Field of Classification Search
CPC ....... H01L 23/48; H01L 23/52; H01L 23/481; H01L 2224/18; H01L 2224/19; H01L 2224/78611; H01L 2224/82986; H05K 13/00; H05K 13/0015; H05K 13/0023; H05K 1/18; H05K 1/181; H05K 3/34; H05K 2201/1053; Y10T 29/49128; Y02P 70/611
See application file for complete search history.

(56) References Cited

U.S. PATENT DOCUMENTS

| | | | |
|---|---|---|---|
| 6,967,474 B2 * | 11/2005 | Bonaria | G01R 31/2887 324/750.22 |
| 7,304,486 B2 * | 12/2007 | Petersen | G01R 1/073 324/750.16 |

(Continued)

OTHER PUBLICATIONS

Design, Fabrication and Assembly of 3-D Microstructures, PhD Dissertation by Ping Zhang, Univ. of Texas,(Arligton) May 2007.*

*Primary Examiner* — Carl Arbes
(74) *Attorney, Agent, or Firm* — The Webb Law Firm

(57) ABSTRACT

Apparatuses and methods related to the field of microchip assembly and handling, in particular to devices and methods for assembling and handling microchips manufactured with solid edge-to-edge interconnects, such as Quilt Packaging® interconnect technology. Specialized assembly tools are configured to pick up one or more microchips, place the microchips in a specified location aligned to a substrate, package, or another microchip, and facilitate electrical contact through one of a variety of approaches, including solder reflow. This specialized assembly tooling performs heating functions to reflow solder to establish electrical and mechanical interconnections between multiple microchips. Additionally, the interconnected microchips may be arranged in an arbitrarily large array.

5 Claims, 8 Drawing Sheets

(56) References Cited

U.S. PATENT DOCUMENTS

| | | | | |
|---|---|---|---|---|
| 7,323,890 B2 * | 1/2008 | Petersen | ............ | G01R 1/06733 324/754.11 |
| 7,608,919 B1 * | 10/2009 | Bernstein | ................ | H01L 23/60 257/685 |
| 7,612,443 B1 * | 11/2009 | Bernstein | ................ | H01L 23/60 257/685 |
| 7,878,755 B2 * | 2/2011 | Klomp | ................ | G03F 7/7075 414/217 |
| 8,227,904 B2 * | 7/2012 | Braunisch | ........... | H01L 23/5385 257/686 |
| 2002/0061662 A1 * | 5/2002 | Boggild | .................... | B25J 7/00 438/800 |

* cited by examiner

METHOD OF INTERCONNECTING MICROCHIPS

CROSS REFERENCE TO RELATED APPLICATION

This application claims priority from U.S. Provisional Application No. 61/802,504, filed Mar. 16, 2013, which is incorporated herein by reference.

BACKGROUND OF THE INVENTION

Field of the Invention

The described apparatuses and methods relate to the field of microchip handling and assembly. More particularly, the described apparatus and methods relate to the handling and assembly of microchips configured with solid edge-to-edge interconnects.

Description of Related Art

Generally, electronic systems are comprised of multiple discrete microchips. These microchips work together, along with other peripheral devices, to accomplish particular tasks. For the system to function, the discrete microchips must be electrically connected, both to each other and to any other components contained within the system. A wide variety of methods presently exists to accomplish this connectivity, including wire-bonding, bump-bonding, flip-chip, through-silicon-via (TSV), and chip-on-board. Each of these methods is specialized to function with an associated interconnect technology. Specialized assembly and packaging tools are used to handle, align, interconnect, and package microchips. These tools must be designed to accommodate the particular packaging and interconnection approach selected. As new interconnect technologies are created, it becomes necessary to develop new specialized methods and tools to effectively connect microchips using the new technology. Accordingly, there exists a need for new assembly methods and apparatuses that are capable of functioning with cutting-edge interconnect technologies.

SUMMARY OF THE INVENTION

The following presents a simplified summary in order to provide a basic understanding of some aspects of the claimed subject matter. This summary is not an extensive overview. It is not intended either to identify key or critical elements or to delineate the scope of the claimed subject matter. Its sole purpose is to present some concepts in a simplified form as a prelude to the more detailed description that is presented later.

With the creation of microchips configured with solid edge-to-edge interconnects, a need has arisen for new, specialized tools and methods to effectively connect discrete microchips together. For example, existing methods are incapable of the precision alignment required to connect multiple edge-based contact points. Further, existing methods are inadequate at reliably forming functional mechanical and electrical connections directly between adjacent microchips.

Accordingly, the described apparatuses and methods relate to the field of microchip assembly and handling, in particular to devices and methods for assembling and handling microchips manufactured with solid edge-to-edge interconnects, such as Quilt Packaging® interconnect technology. Specialized assembly tools are described that are configured to pick up one or more microchips, place the microchips in a specified location aligned to a substrate, package, or another microchip, and facilitate electrical contact through one of a variety of approaches, including solder reflow. This specialized assembly tooling performs heating functions to reflow solder to establish electrical and mechanical interconnections between multiple microchips.

In an embodiment, after two or more microchips have been positioned and interconnected on a package, the assembly tooling can finish either by sealing the package with a cover or sealant or by moving the assembled unit along for further processing.

In an embodiment, a device is capable of performing the precision alignment needed to join solid edge-to-edge interconnect structures and prevent lateral movement and pressure during solder reflow. In another embodiment, vacuum is used to hold multiple microchips in place while additional microchips of the same or varying geometries, sizes, and thicknesses are aligned into an interconnected array or quilt. In an embodiment, microchips can be assembled into such an array either on a stage and then reflowed or alternatively assembled directly on a package or substrate and reflowed. In an embodiment, microchips can be assembled either orthogonally or at other angles to one another. After assembly, the array of interconnected microchips can be moved into a package, onto a substrate or board, encapsulated, or otherwise protected by the application of a protective material, such as an epoxy or polymer.

To the accomplishment of the foregoing and related ends, certain illustrative aspects of the claimed subject matter are described herein in connection with the following description and the annexed drawings. These aspects are indicative of various ways in which the subject matter may be practiced, all of which are intended to be within the scope of the claimed subject matter. Other advantages and novel features may become apparent from the following detailed description when considered in conjunction with the drawings.

More specifically, disclosed herein is a method for interconnecting microchips comprising: (a) positioning a first microchip using a first manipulator, wherein the first microchip has a set of first nodules located on an edge of the first microchip; (b) securing the first microchip in place; (c) positioning a second microchip using a second manipulator, wherein the second microchip has a set of second nodules located on an edge of the second microchip; (d) moving the second microchip so that the set of second nodules is positioned proximate to the set of first nodules; (e) securing the second microchip in place; and (f) joining the set of first nodules to the set of second nodules to interconnect the first and second microchips.

The set of first nodules can be located closest to a top face of the first microchip. The set of second nodules can be located closest to a top face of the second microchip.

The first microchip and the second microchip can be positioned top-face down on a substrate. The substrate can include a conductive segment or contact that is joined to one nodule of the set of first nodules and one nodule of the set of second nodules when the first second microchips are positioned top-face down on the substrate.

The sets of first and second nodules can maintain the first and second microchips in spaced relation when the first and second sets of nodules and the conductive segment or contact are joined.

The edge of the first microchip can be defined by the intersection of a top face of the first microchip and a side of the first microchip. The edge of the second microchip can be defined by the intersection of a top face of the second microchip and a side of the second microchip.

The first microchip and the second microchip can be positioned top-face down on a substrate. The substrate can include a conductive segment or contact. The method can include joining the conductive segment or contact to one nodule of the set of first nodules and one nodule of the set of second nodules.

Each set of nodules can include at least one nodule.

Also disclosed herein is a microchip unit comprising: a first microchip having a set of first nodules located along and projecting from an edge of the first microchip, wherein the edge of the first microchip is defined at an intersection of a top surface and another surface of the first microchip; a second microchip having a set of second nodules located along and projecting from an edge of the second microchip, wherein the edge of the second microchip is defined at an intersection of a top surface and another surface of the second microchip; and a substrate having a conductive segment or contact. The first and second microchips are positioned top-face down on the substrate with the first and second sets of nodules joined with each other with the first and second microchips in spaced relation and with the conductive segment or contact joined to one nodule of the set of first nodules and one nodule of the set of second nodules.

A surface of at least one nodule of the first set of nodules can be generally coplanar with the top surface of the first microchip. A surface of at least one nodule of the second set of nodules can be generally coplanar with the top surface of the second microchip.

BRIEF DESCRIPTION OF THE DRAWINGS

The systems, devices, and methods may be better understood by referring to the following description in conjunction with the accompanying drawings. The components in the figures are not necessarily to scale and simply illustrate the principles of the systems, devices, and methods. For example, elements in the figures may be exaggerated in size to better aid in the understanding of the portrayed embodiments. The accompanying drawings illustrate only possible embodiments of the systems, devices, and methods and are therefore not to be considered limiting in scope.

DETAILED DESCRIPTION OF THE INVENTION

Figure 1:
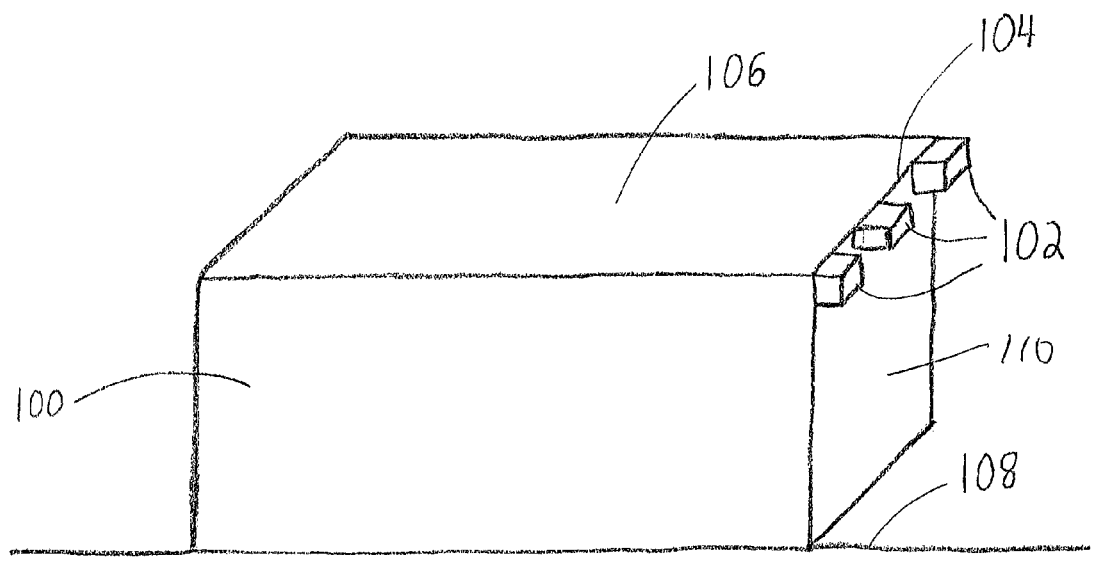
FIG. 1 depicts a microchip including edge interconnects or nodules.

It is advantageous to define several terms before describing particular embodiments. It should be appreciated that the following definitions are used throughout this application.

Definitions

Where the definition of terms departs from the commonly used meaning of the term, the definitions provided below are intended, unless specifically indicated otherwise.

For the purposes of the present description, the term "direct electrical connection" refers to the direct contact between interconnect nodules or between an interconnect nodule and an electrical contact so that electrical conduction current may pass between them.

For the purposes of the present description, the term "electronic device" refers to electronic circuitry and any device that includes electronic circuitry. Examples of electronic devices include, but are not limited to, microchips, package systems, transistors, printed circuit boards (PCBs), amplifiers, sensors, inductors, capacitors, electrical connectors into which microchips may be plugged, etc.

For the purposes of the present description, the term "interposer" refers to any structure whose purpose is to extend or complete a conductive electrical connection between two electronic devices. In some embodiments, the conductive electrical connection between interconnect nodules or between an interconnect nodule and a contact may not be direct. For example, in some embodiments, a conductive material, such as solder, may electrically connect two interconnect nodules or an interconnect nodule with an electrical contact. Also, in some embodiments, connectors of various types may help conductively join interconnect nodules.

For the purposes of the present description, the term "microchip" refers to any kind of chip having microfabricated or nanofabricated systems built thereon. Microchips include not only conventional integrated circuits but also Microelectromechanical Systems (MEMS) chips and other related technologies.

For the purposes of the present description, the term "complementary nodules" refers to two microchips containing nodules arranged in a mirrored pattern to one another. In other words, two microchips with complementary nodules are capable of being aligned to form an electrical connection between the two microchips via the nodules.

DESCRIPTION

Aspects of the system and methods are described below with reference to illustrative embodiments. The references to illustrative embodiments below are not made to limit the scope of the claimed subject matter. Instead, illustrative embodiments are used to aid in the description of various aspects of the systems and methods. The description, made by way of example and reference to illustrative reference, is not meant to being limiting with regards to any aspect of the claimed subject matter.

Devices and methods described in this application are particularly well-adapted for use in joining microchips manufactured with solid edge-to-edge interconnects, such as Quilt Packaging® interconnect technology, and will be described in that context. However, it will become apparent that this description is not illustrative of the only utility of the described devices and methods.

The assembly of advanced system-in-package (SiP) designs using innovative packaging and interconnect technology requires substantial innovation in assembly and handling tools and methods. Current approaches for assembling and packaging microchips are wholly unsuited for advanced SiP designs. Accordingly, there exists a long-felt but unaddressed need for improved apparatuses and methods for precisely and reliably assembling advanced SiP designs.

FIG. 1 depicts a microchip 100 configured with solid edge-to-edge interconnects, such as those employed in microchips configured with Quilt Packaging® interconnect technology and described in U.S. Pat. Nos. 7,608,919 and 7,612,443 to Bernstein et al. which are incorporated herein by reference. "Quilt Packaging" is a U.S. registered trademark of Indiana Integrated Circuits, LLC, U.S. Registration No. 4214679.

As shown in FIG. 1, nodules 102 made of metal or another conductive material are located along and extend from at least one edge 104 or surface 110 of microchip 100. These nodules 102 are used to electrically and mechanically connect microchips together, either through a direct electrical connection or via an interposer (such as solder). As shown here, nodules 102 are located near the top face 106 (or surface) of microchip 100. Generally, nodules 102 are either located contiguous to or a predetermined distance below top face 106 of microchip 100. The placement of nodules 102 may be standardized for a single microchip (so that all of the nodules are located the same distance below top face 106) or across different microchips to facilitate alignment of nodules 102 on different microchips. However, one of skill in the art will appreciate that nodules 102 may be placed at any point along the edge 104 of the microchip 100, so long as the two microchips to be joined have complementary nodules 102.

Microchip 100 is depicted in face-up orientation, such that when microchip 100 is placed on a supporting surface 108, the face closest to the nodules 102 (top face 106) is exposed. Conversely, a microchip would be termed face-down if top face 106 (the face closest to the nodules 102) were in contact with supporting surface 108, such that top face 106 was not exposed. Placing two microchips 100 configured with complementary nodules 102 adjacent to one another, such that the nodules 102 of the first microchip 100 contact the nodules 102 of a second microchip 100, forms a direct electrical connection between the two microchips. Alternatively, the nodules 102 may be positioned such that they are close together but not in direct physical contact, allowing an indirect electrical connection between the two microchips through an interposer (such as solder).

As described hereinafter, microchips may be joined together in a more permanent fashion to form a stable electrical and mechanical connection between them. An arbitrary number of microchips may be joined together to form an arbitrarily large array, allowing for electrical connections between each microchip and its neighbors. To facilitate the creation of electrical and mechanical connections between multiple microchips, in an embodiment, these nodules 102 are created with a coating of solder. This solder may further be used as an interposer to facilitate indirect electrical connections.

Figure 2:
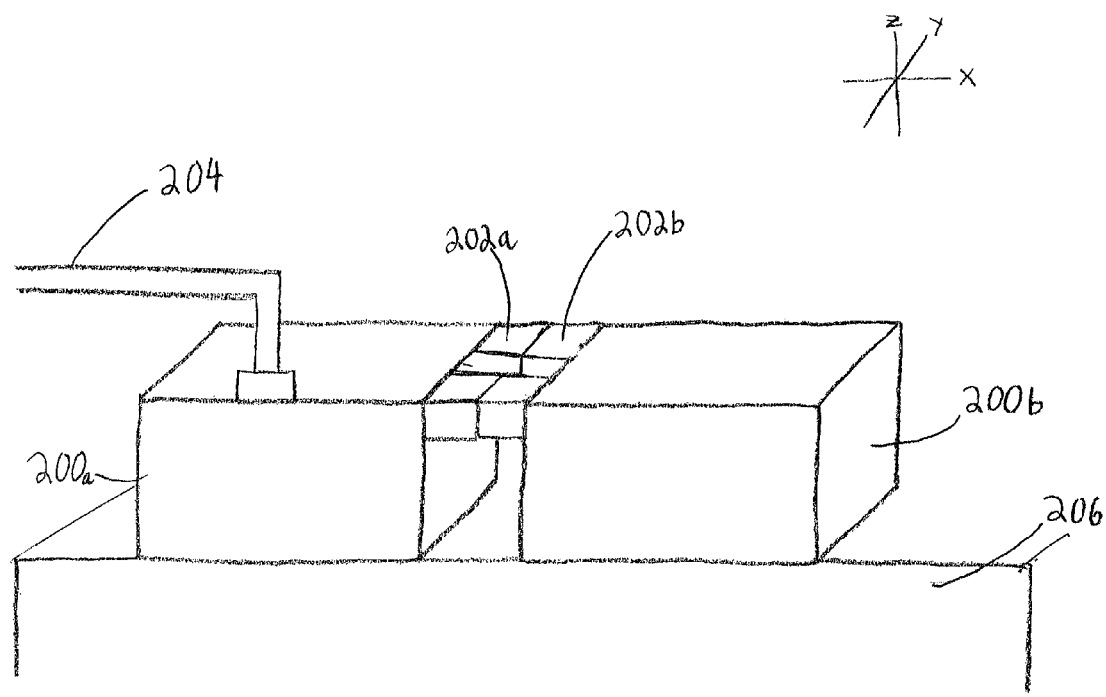
FIG. 2 depicts interconnecting two microchips on a substrate via edge interconnects or nodules on each substrate.

Referring to FIG. 2, in one embodiment, a method is provided for connecting two microchips 200a, 200b. A manipulator 204 (such as a vacuum tool or a mechanical probe) places a first microchip 200a face-up on a substrate 206 and maneuvers microchip 200a into position. As used herein, the term "substrate" is a supporting surface or stage. Alternatively, first microchip 200a could be placed into position on a package, for example, to allow two microchips to be simultaneously joined to each other and then immediately sealed into the package. In this instance, the package could be placed on substrate 206 and secured into position prior to the microchip being placed on or in the package.

Once first microchip 200a has been correctly positioned, it is secured in place. In an embodiment, first microchip 200a is secured in place by applying vacuum pressure via substrate 206. For example, holes may be included in substrate 206 through which vacuum may be applied to the back-side of first microchip 200a. The amount of vacuum applied through each hole or subset of holes may be individually controlled, allowing different amounts of vacuum to exist at different locations on substrate 206. Accordingly, a higher vacuum pressure could be applied to one microchip while a lower vacuum pressure is applied to a second microchip—preventing the first microchip from moving while requiring a predetermined amount of force to move the second microchip. For example, the necessity of using a predetermined amount of force to overcome the vacuum and move the second microchip would decrease the likelihood of the second microchip accidently moving. Alternatively, first microchip 200a may be held in place by manipulator 204 or another physical restraint, such as a clip, backstop or brace attached to the substrate 206.

After first microchip 200a is secured in place, a second microchip 200b is then placed on substrate 206 by manipulator 204 and aligned with first microchip 200a in the y-axis. In an embodiment, second microchip 200b is lightly restrained against substrate 206 by applying vacuum through holes located in substrate 206, so as to make it easier to perform the necessary fine adjustments to properly position second microchip 200b. In another embodiment, physical features on substrate 206 (such as grooves, walls, etc.) are used to properly position second microchip 200b and prevent it from moving in the y-axis. Manipulator 204 then moves second microchip 200b along the x-axis until it is in contact with the first microchip. More specifically, second microchip 200b may be moved along any path until nodules 202b on second microchip 200b are in contact with nodules 202a on first microchip 200a. In an embodiment, lateral pressure is applied between the first and second microchips 200a, 200b (for example, by manipulator 204) along the x-axis.

As improper alignment may result in some or all of nodules 202 failing to form electrical or mechanical connections, in an embodiment the alignment of two or more pairs of nodules 202a, 202b located at opposite edges of two microchips 200a, 200b are checked, for example, through the use of machine vision or electrical testing using a probe. As an example, if microchips 200a, 200b are slightly misaligned or if one of the microchips is skewed, a first pair of nodules 202 at one end of the set of nodules could be perfectly positioned for connection while the last pair of nodules (located at the opposite end of the chips) could be significantly misaligned. In an embodiment, larger nodules are created at each edge of the microchip to further facilitate proper x/y alignment.

Referring again to FIG. 2, second microchip 200b is then held securely in place similarly to first microchip 200a. As will be apparent to one of skill in the art, multiple manipulators 204 could be used, for example, to secure or position both microchips 200a, 200b simultaneously or to enable microchips 200a, 200b to be held in place without the use of vacuum or another physical restraint on substrate 206.

After the two microchips 200a, 200b have both been secured in place to substrate 206, microchips 200a, 200b are connected together, both electrically and mechanically. In one embodiment, microchips 200a, 200b are connected through a solder reflow process. Nodules 202a, 202b, located along the edges of microchips 200a, 200b that are to be joined together, are coated in solder or a similar material prior to positioning the two microchips 200a, 200b together. Then, when the two microchips 200a, 200b are positioned together, nodules 202a on first microchip 200a are placed in contact with nodules 202b on second microchip 200b. Localized heat (e.g., from a hot air reflow gun, an infrared reflow gun, a soldering iron, a light bulb, or another localized heat source) is then applied to nodules 202a, 202b to melt the solder, allowing the solder on nodules 202a to melt and merge with solder on nodules 202b, forming multiple continuous connections between microchips 200a, 200b at each pair of nodules 202a, 202b. The heat is then removed from nodules 202a, 202b, allowing the reflowed solder to cool and solidify into an unbroken electrical and mechanical connection between the two microchips 200a, 200b.

Alternatively, heat can be applied to the entirety of both microchips 200a, 200b (e.g., by using heaters located in the substrate, heating the air surrounding microchips 200a, 200b, or another generalized heat source) to raise the temperature of both microchips 200a, 200b to some temperature T1 which is less than the melting point of the solder. A second, localized heat source is then used to raise the temperature of the solder on nodules 202a, 202b to a second temperature T2, which is at or above the reflow temperature of the solder. Among other advantages, this enables the solder to melt more quickly and avoids subjecting the entirety of both microchips 200a, 200b to high temperatures (such as T2), which could potentially damage microchips 200a, 200b. Additionally, a less intense localized heat source may be used to avoid damaging microchips 200a, 200b and to consume less power. In another embodiment, nodules 202a, 202b on microchips 200a, 200b are joined through a welding process, such as laser welding. Alternatively, melted solder or a conductive epoxy can be applied to nodules 202a, 202b to form direct or indirect connections between the microchips 200a, 200b.

After microchips 200a, 200b have been connected together to form a multi-chip device, post-processing, such as packaging, may be performed. If microchips 200a, 200b were connected together inside a package, the multi-chip device can then be directly connected to the package through a process such as wire-bonding. Alternatively, the multi-chip device may be encapsulated or otherwise protected by the application of a protective material, such as an epoxy or polymer.

Figure 3:
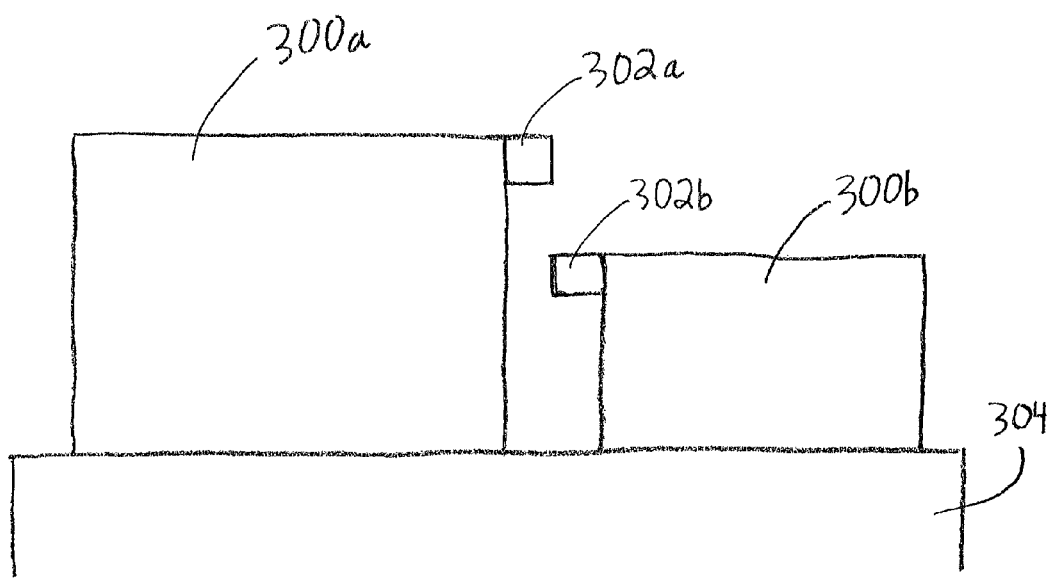
FIG. 3 depicts difficulties in interconnecting two microchips of different thicknesses on a substrate, where the edge interconnects or nodules are at different heights from the surface of the substrate.

Referring to FIG. 3, the difficulties inherent to connecting two microchips 300a, 300b of different thicknesses is shown. In order to form a reliable electrical connection, nodules 302a on first microchip 300a must be properly aligned with nodules 302b on second microchip 300b. To form a direct electrical connection, each pair of nodules should be in direct physical contact with one another. Alternatively, an indirect electrical connection can be formed through the use of an interposer, such as solder. This allows an electrical connection to be established even if the nodules are slightly misaligned. As shown in FIG. 3, when microchips of different thicknesses are to be connected together, it may be difficult or impossible to form a direct electrical connection between microchips 300a, 300b by placing them adjacent to one another in a face-up orientation, as nodules 302a, 302b will be located at different heights off substrate 304. Further, as depicted in FIG. 3, if the distance between the nodules 302a on the first microchip 300a and the nodules 302b on the second microchip 300b is great enough, it may be impossible to form a reliable electrical connection even with the use of an interposer.

Figure 4:
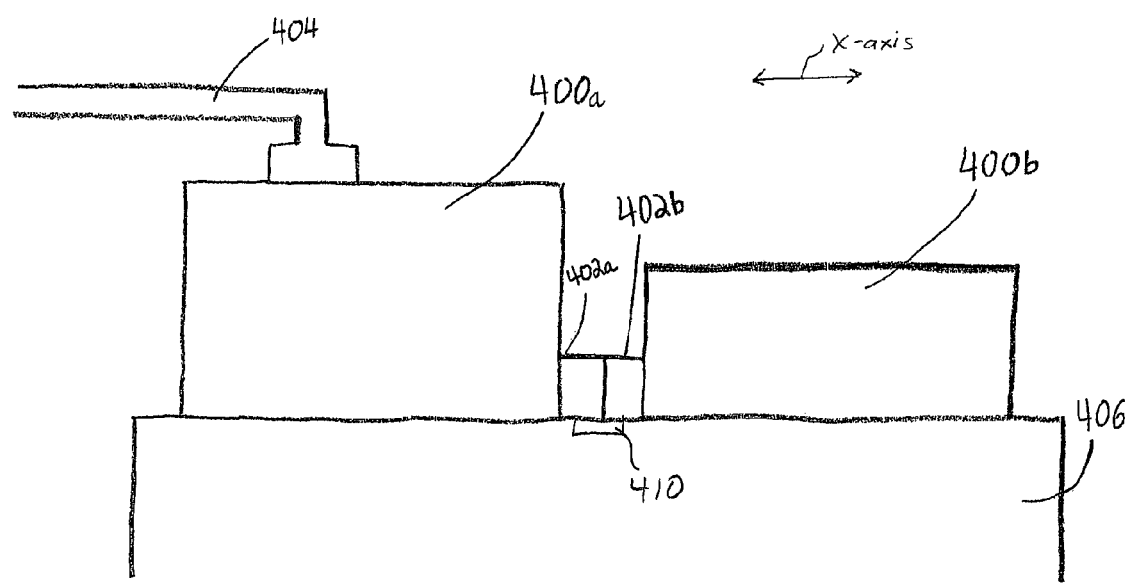
FIG. 4 depicts interconnecting two microchips of different thicknesses on a substrate via edge interconnects or nodules on each substrate.

Referring to FIG. 4, a method of joining two or more microchips 400a, 400b of different heights to form a microchip unit is described. A first microchip 400a is placed face-down on a substrate 406 (e.g., a stage, package, or printed circuit board) by a manipulator 404 and maneuvered into position. The substrate 406 may be composed of a material to which solder will not adhere (e.g., a non-metallic compound) to avoid having the microchips 400a, 400b inadvertently connected to the substrate 406. Once it is properly positioned, first microchip 400a is secured in place. Manipulator 404 then places a second microchip 400b face-down on substrate 406, aligns the two microchips 400a, 400b, and moves second microchip 400b such that nodules 402b are aligned with nodules 402a on first microchip 400a. In an embodiment, lateral pressure is applied along the x-axis between the first and second microchips 400a, 400b (for example, by the manipulator 404). Second microchip 400b is then held securely in place similarly to first microchip 400a. As will be apparent to one of skill in the art, multiple manipulators 404 could be used, for example, to secure or position both microchips 400a, 400b simultaneously.

As both microchips are located face-down, the nodules 402a, 402b are located the same distance above the substrate 406 regardless of whether the two microchips 400a, 400b are of equal thicknesses. This allows microchips manufactured from different materials (or wafers of varying thicknesses) to be joined, so long as the microchips have complementary nodules that are manufactured contiguous to or a predetermined distance below the top face of the respective microchip. As described above, modules 402a, 402b are then joined (e.g., by using solder reflow).

Also or alternatively, substrate 406 may include a conductive segment or contact 410 positioned in alignment with nodules 402a, 402b when microchips 400a, 400b are positioned as shown in FIG. 4. In an embodiment, conductive segment or contact 410 may be connected to one or more other electronic devices of substrate 406 or disposed on substrate 406. In an embodiment, conductive segment or contact 410 may be a conductive trace or contact on substrate 406 which in an embodiment may be a printed circuit board. Once nodules 402a, 402b are located in alignment with conductive segment or contact 410 as shown in FIG. 4, nodules 402a, 402b and conductive segment or contact 410 are joined electrically in any suitable and/or desirable manner (e.g., via solder reflow). An advantage of nodules 402a, 402b in alignment with conductive segment or contact 410 is the facilitation of the visual inspection of nodules 402a, 402b and conductive segment or contact 410 after joining together, rework of a faulty joining together, and spacing between microchips 400a, 400b while simultaneously forming an electrical connection between nodules 400a, 400b and conductive segment or contact 410 thereby facilitating a flow of cooling fluid (air) between microchips 400a, 400b.

Figure 5:
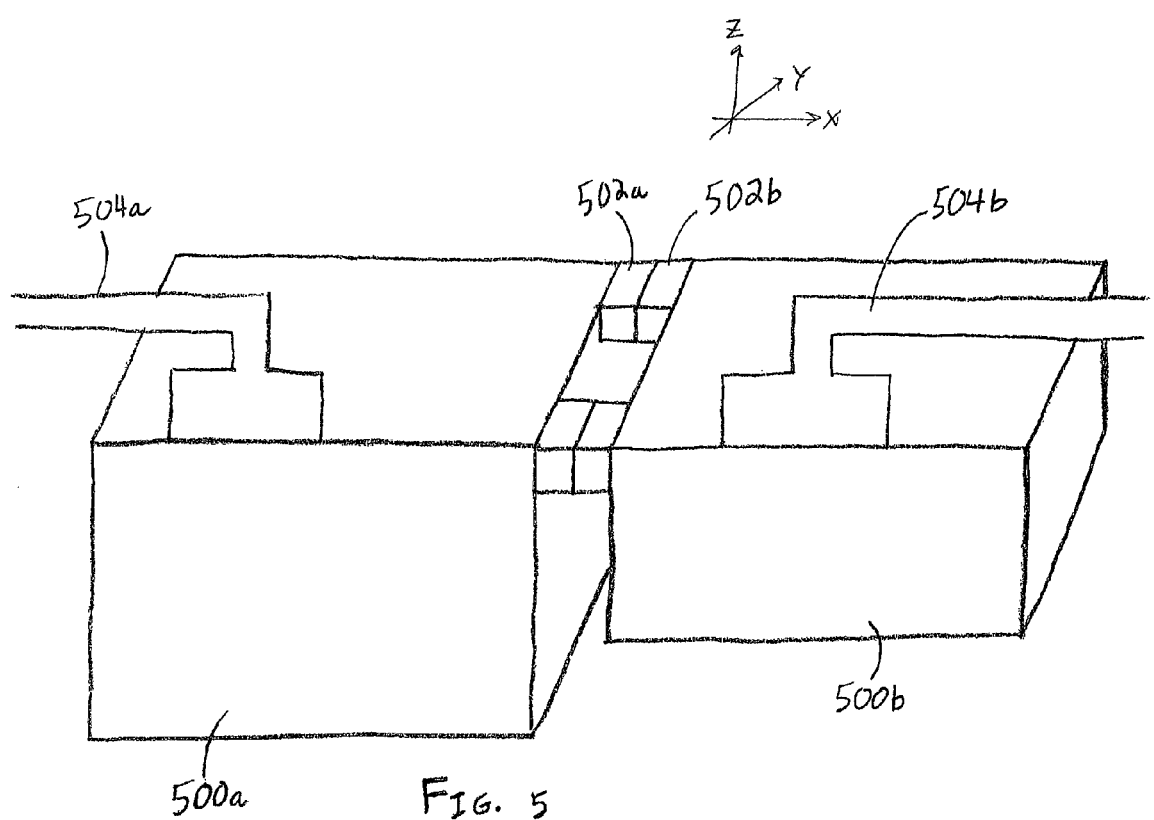
FIG. 5 depicts interconnecting two microchips using multiple manipulators.

Referring to FIG. 5, a method of joining two or more microchips 500a, 500b of different heights without using a stage or other surface is described. As shown in FIG. 5, a first manipulator 504a positions a first microchip 500a in space. First microchip 500a is then secured in place (e.g., by locking manipulator 504a in place). A second manipulator 504b positions a second microchip 500b in space. For example, second manipulator 504b will align the nodules 502a, 502b of the two microchips 500a, 500b along both the y- and z-axes. As will be clear to one of skill in the art, this allows for microchips of different thicknesses to be easily connected. Second manipulator 504*b* is then prevented from moving in the aligned axes. Second manipulator 504*b* then moves the second microchip 500*b* along the x-axis until nodules 502*b* on second microchip 500*b* contact nodules 502*a* on first microchip 500*a*. One or both of manipulators 504*a*, 504*b* then apply lateral pressure between microchips 500*a*, 500*b* along the x-axis. Second microchip 500*b* is then secured in space (e.g., by locking second manipulator 504*b* from moving). Microchips 500*a*, 500*b* are then joined, for example, via solder reflow.

Figure 6A:
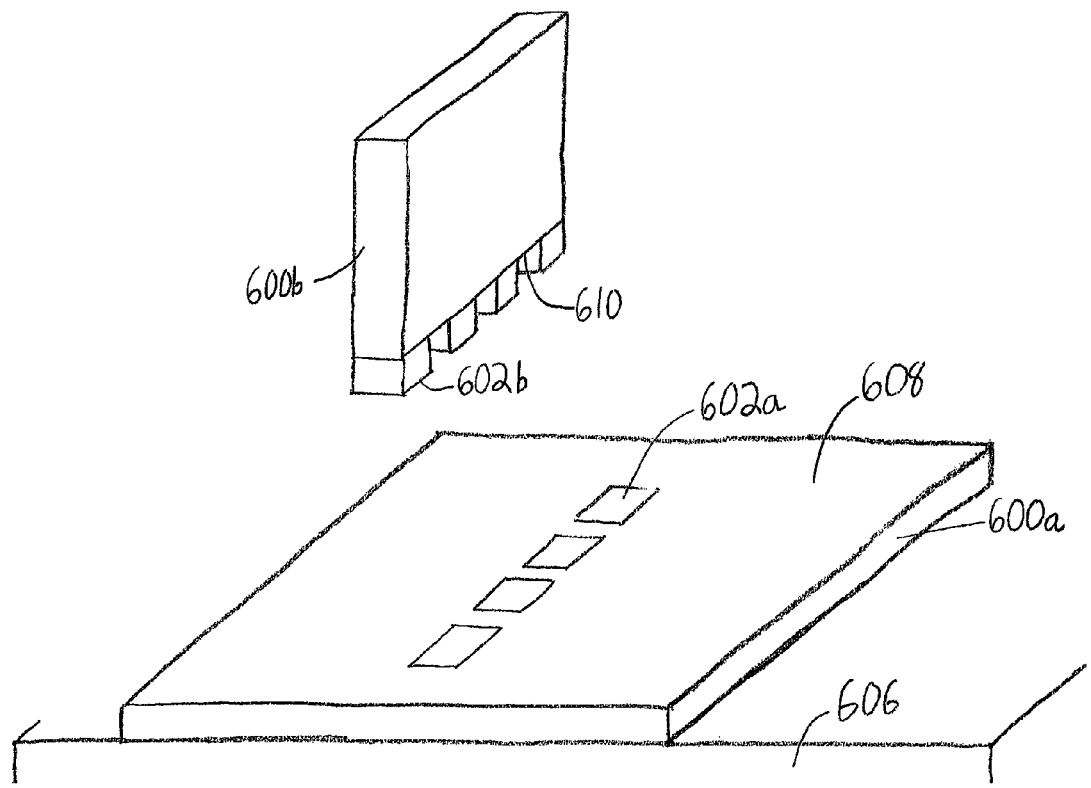
FIG. 6A depicts two microchips aligned in three-dimensional space.
Figure 6B:
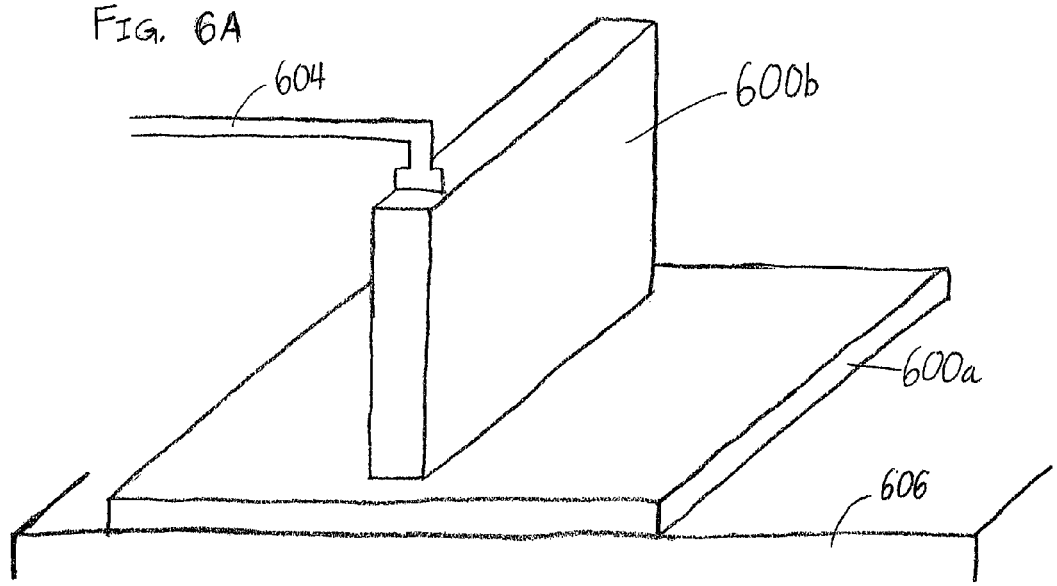
FIG. 6B depicts the two microchips of FIG. 6A interconnected in three-dimensional space.

Referring to FIGS. 6A and 6B, a method of joining two or more microchips 600*a*, 600*b* into three-dimensional (3D) arrangements is described. A first microchip 600*a* is positioned on a substrate 606 using a manipulator 604 and subsequently is secured in place. The first microchip 600*a* is created with holes or sockets 602*a* located along its top face 608. In one embodiment, these holes are coated in solder. A second microchip 600*b* is then positioned above first microchip 600*a* by manipulator 604. Each of the nodules 602*b* along an edge 610 of second microchip 600*b* is aligned with respective holes or sockets 602*a* on first microchip 600*a*. As described above, merely aligning a single nodule-hole pair may cause an inadequate or non-existent connection between some nodules 602*b* and holes 602*a* if microchips 600*b*, 600*a* are misaligned or skewed, as other nodule-hole pairs may be misaligned. Accordingly, in an embodiment, two or more nodule-hole pairs located at opposite ends of second microchip 600*b* are checked to ensure proper alignment has been achieved.

As shown in FIG. 6B, nodules 602*b* on second microchip 600*b* are then moved into alignment and contact holes or sockets 602*a* on first microchip 600*a* and pressure is applied between the two microchips 600*a*, 600*b*, for example by the manipulator 604 to press nodules 602*b* into holes 602*a*. The two microchips 600*a*, 600*b* are then joined, for example by using solder reflow. Additional microchips can then be connected to either the first or second microchip 600*a*, 600*b* in similar fashion. In an alternative embodiment, first microchip 600*a* could be held by a manipulator and positioned in space, without using a stage to support it. Second microchip 600*b* could then be aligned and moved into alignment and contact with first microchip 600*a* by a second manipulator. This process could be repeated for any number of microchips, thereby creating a three-dimensional array of interconnected microchips.

Figure 7:
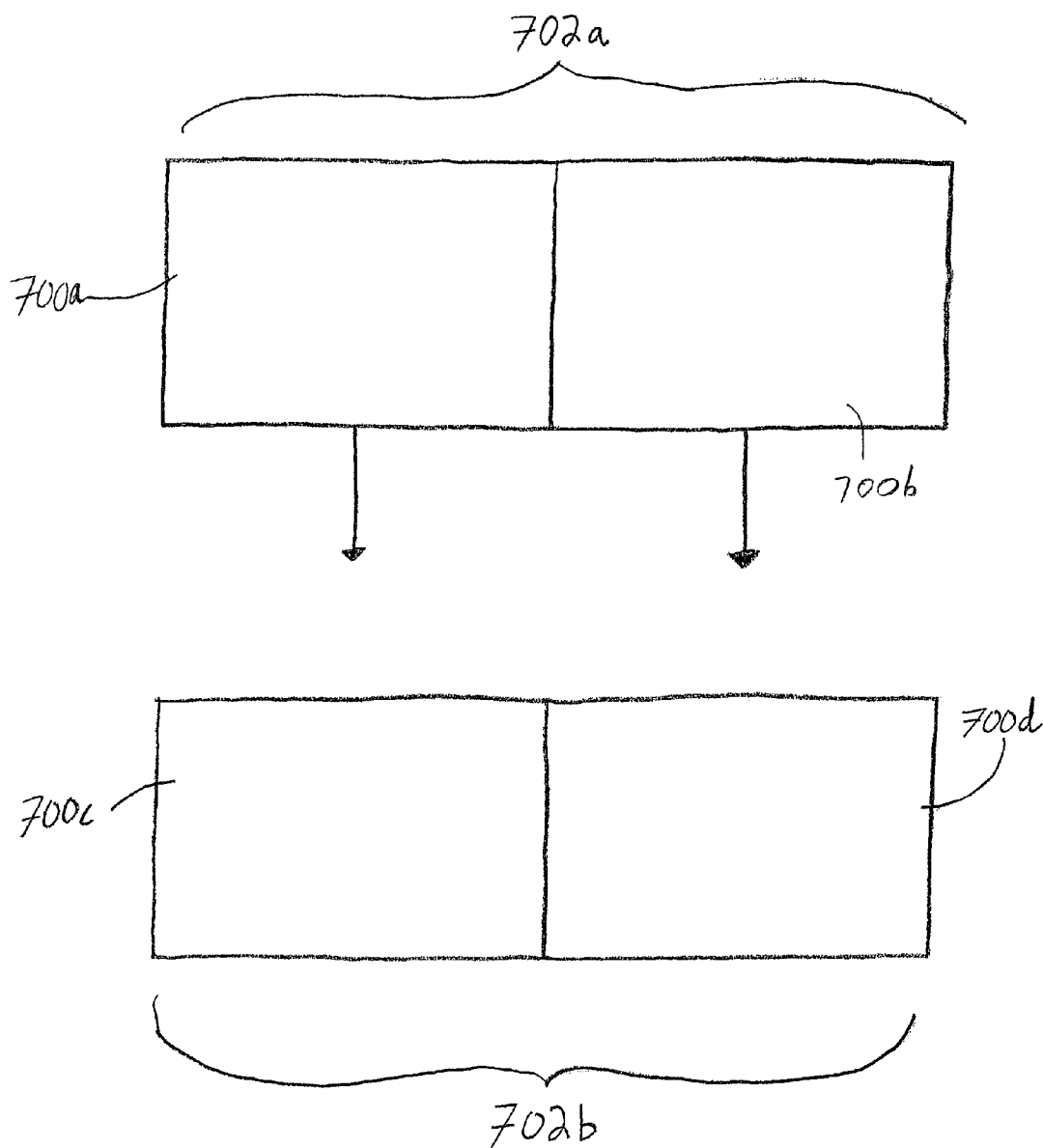
FIG. 7 depicts four microchips interconnected or positioned to be interconnected together.
Figure 8:
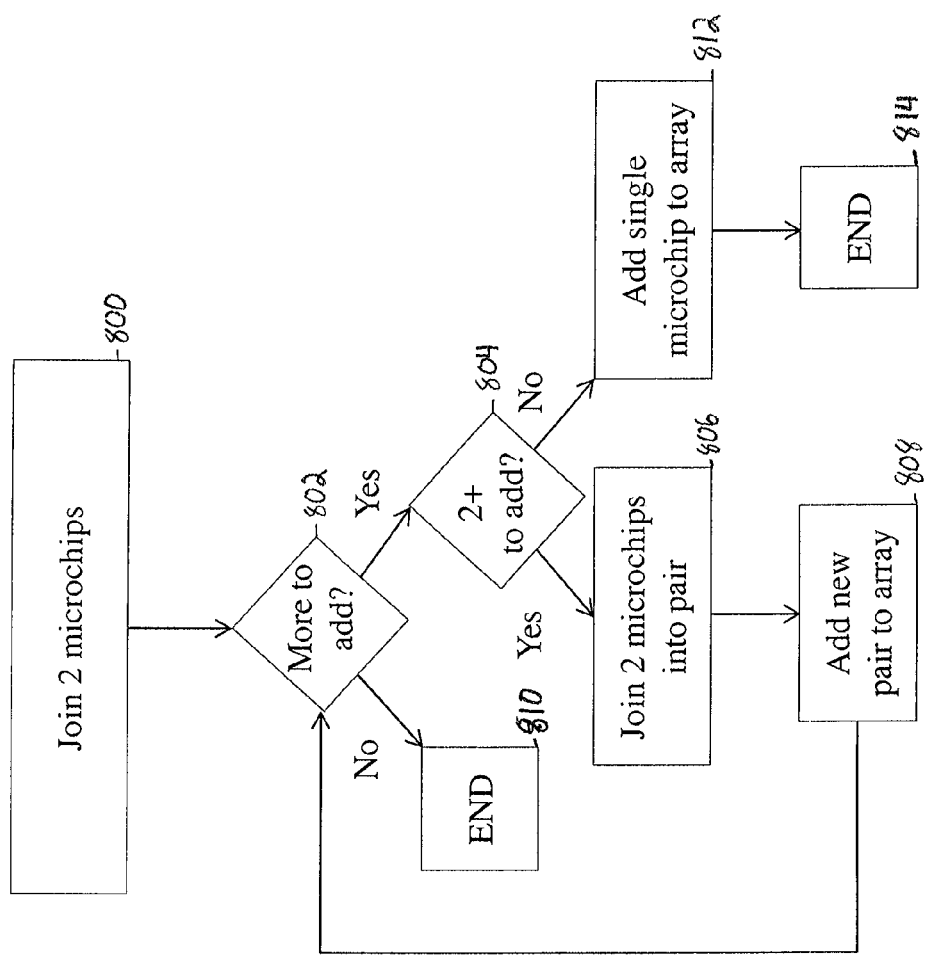
FIG. 8 is a flow diagram of a method for interconnecting an arbitrarily large array of microchips.

Referring to FIGS. 7 and 8, a method of joining an arbitrary number of microchips is described. As shown in FIG. 7, four microchips 700*a*, 700*b*, 700*c*, 700*d* may be joined into a 2×2 array by first creating two pairs 702*a*, 702*b* of connected microchips—joined together in any manner described herein. Then, the two pairs 702*a*, 702*b* of microchips are joined together, in any manner described herein, to form a single array composed of four interconnected microchips 700*a*, 700*b*, 700*c*, 700*d*.

As will be understood by one of skill in the art, an arbitrary number of microchips could be joined together in any manner described herein together in any manner described herein in similar fashion. For example, a system comprised of an odd number of microchips could be formed by first forming and connecting pairs of microchips and then joining a single unpaired microchip. Similarly, an arbitrary number of microchips of different shapes or sizes could be joined into an interconnected array using this technique. For example, nodules may be located along the interior edges of all microchips in the array, forming electrical and mechanical connections between all adjacent microchips and allowing each microchip to communicate directly with all adjacent microchips. Similarly, microchips may relay signals, so as to allow non-adjacent microchips in the array to communicate. Additional nodules could be formed along exterior edges, for example to allow additional microchips or other electrical devices to be connected to the array.

FIG. 8 depicts a generalized process for creating an arbitrarily large array of interconnected microchips. As described above, in step 800, two microchips are joined (creating a pair of microchips). At step 802, a determination is made if additional microchips need to be added to the array. If no microchips need to be added, then the process ends at step 810. If more microchips need to be added, then a determination is made at step 804 whether there are two or more microchips to add. If so, then two microchips are joined into a pair at step 806 and are added to the array at step 808. The process then repeats by checking whether more microchips need to be added at step 802. Alternatively, if there is only a single microchip to add at step 804, then the single microchip is added at step 812 and the process ends at step 814.

As will be clear to one of ordinary skill in the art, the process described in FIG. 8 creates an array of microchips that is two microchips wide and an unlimited number of microchips long. Alternatively, the process may be modified to create an array of arbitrary size. For example, a 8×8 array of sixty-four square microchips could be created by first creating thirty-two pairs of microchips, as described above. Each pair (or 2×1 array) is then treated as a single microchip, and paired again to create sixteen 2×2 arrays. The process repeats, successively pairing microchips to create eight 4×2 arrays, four 4×4 arrays, two 8×4 arrays, and finally a single 8×8 array. A similar form of this process could be used to join microchips of any shape into an array of arbitrary size.

What has been described above includes examples of aspects of the claimed subject matter. It is, of course, not possible to describe every conceivable combination of components or methodologies for purposes of describing the claimed subject matter, but one of ordinary skill in the art may recognize that many further combinations and permutations of the disclosed subject matter are possible. Accordingly, the disclosed subject matter is intended to embrace all such alterations, modifications, and variations that fall within the spirit and scope of the appended claims. Furthermore, to the extent that the terms "includes", "has", "having", or variations in form thereof are used in either the detailed description or the claims, such terms are intended to be inclusive in a manner similar to the term "comprising" as "comprising" is interpreted when employed as a transitional word in a claim.

The invention claimed is:
1. A method for interconnecting microchips comprising:
(a) positioning a first microchip using a first manipulator, wherein the first microchip has a set of first conductive nodules located along and extending from an edge of the first microchip;
(b) securing the first microchip in place on a substrate;
(c) positioning a second microchip using a second manipulator, wherein the second microchip has a set of second conductive nodules located along and extending from an edge of the second microchip;
(d) moving the second microchip so that the set of second conductive nodules is positioned proximate to the set of first conductive nodules;
(e) securing the second microchip in place on the substrate; and

(f) joining the set of first conductive nodules to the set of second conductive nodules to electrically interconnect the first and second microchips, wherein:
the set of first conductive nodules is located closest to a top face of the first microchip;
the set of second conductive nodules is located closest to a top face of the second microchip; and
the first microchip and the second microchip are positioned top-face down on the substrate.

2. The method of claim 1, wherein:
the substrate includes a conductive segment or contact; and
the method includes joining the conductive segment or contact to one conductive nodule of the set of first conductive nodules and one conductive nodule of the set of second conductive nodules.

3. The method of claim 2, wherein the sets of first and second conductive nodules maintain the first and second microchips in spaced relation when the first and second sets of conductive nodules and the conductive segment or contact are joined.

4. The method of claim 1, wherein:
the edge of the first microchip is defined by the intersection of a top face of the first microchip and a side of the first microchip; and
the edge of the second microchip is defined by the intersection of a top face of the second microchip and a side of the second microchip.

5. The method of claim 1, wherein each set of nodules includes at least one nodule.

* * * * *